(12) United States Patent
Chen

(10) Patent No.: US 6,421,242 B1
(45) Date of Patent: Jul. 16, 2002

(54) HEAT SINK CLIP WITH PRESSING CAM

(75) Inventor: Chun-Chi Chen, Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/910,305

(22) Filed: Jul. 20, 2001

(51) Int. Cl.[7] ............................................. H05K 7/20
(52) U.S. Cl. .................. 361/704; 24/296; 24/458; 165/80.3; 248/510; 257/727; 361/710
(58) Field of Search ............................. 165/80.2, 80.3, 165/185; 174/16.3; 257/706–707, 712–713, 718–719, 726–727; 361/704, 687, 707, 709–710, 719–721; 254/104; 411/509–510, 352, 900, 516, 522; 267/150, 158, 160; 248/316.7, 505, 506, 510; 24/453, 457, 458, 473, 625, 296

(56) References Cited

U.S. PATENT DOCUMENTS

| | | | | |
|---|---|---|---|---|
| 5,828,553 A | * | 10/1998 | Chiou | 361/704 |
| 6,061,239 A | * | 5/2000 | Blomquist | 361/704 |
| 6,082,440 A | * | 7/2000 | Clemens et al. | 165/80.3 |
| 6,181,559 B1 | * | 1/2001 | Seo | 361/704 |
| 6,201,697 B1 | * | 3/2001 | Mccullough | 361/704 |

\* cited by examiner

*Primary Examiner*—Gregory Thompson
(74) *Attorney, Agent, or Firm*—Wei Te Chung

(57) ABSTRACT

A heat sink clip (1) includes a handle portion (10), a connecting portion (20) and a sliding portion (30). The handle portion has two side plates (14), a hook (19) extending perpendicularly from one of the side plates, and a pressing cam (15) formed at a bottom end of the other side plate. Each side plate defines a through hole (18) and an arcuate sliding slot (16) in the vicinity of the bottom end of the side plate. The connecting portion has a first cantilever (22) and a first locking arm (28). The first cantilever has a pair of pivot holes (26) in alignment with the through holes, for extension of a pin (40) therethrough. The sliding portion has a second cantilever (32) and a second locking arm (36). The second cantilever has a pair of pivot tabs (34) for sliding within the sliding slots of the handle portion.

11 Claims, 6 Drawing Sheets

HEAT SINK CLIP WITH PRESSING CAM

BACKGROUND OF THE INVENTION

1. Field of the invention

The present invention relates to means for securing heat sinks, and particularly to heat sink clips for attaching a heat sink to an electronic device such as a computer electronic device.

2. Related art

Many computer electronic devices, such as Central Processing Units (CPUs), generate large amounts of heat during operation. This can deteriorate the operation of the CPU. Consequently, heat sinks are frequently attached to electronic devices to remove heat therefrom. Due to differing coefficients of thermal expansion, a heat sink is usually not glued or otherwise permanently attached to an electronic device. Instead, the heat sink is usually releasably attached to the electronic device with a clip or clips.

Referring to FIGS. 5 and 6, a conventional clip 9 is integrally made from a metal sheet. The clip 9 comprises a pressing portion 2, two spring portions 3 respectively extending from opposite ends of the pressing portion 2, and two legs 4 respectively depending from the spring portions 3. Each leg 4 defines a lower aperture 5 and an upper aperture 6. The lower apertures 5 engage with corresponding catches of a socket (not shown). A handle tab 7 extends outwardly from each leg 4 at a bottom extremity of the upper aperture 6. In installation and in disassembly, a tool (not shown) is required to be inserted into the upper aperture 6. Thus the installation and disassembly procedures are unduly complicated and cumbersome. In addition, the tool can easily slip out of the upper aperture 6. This frequently causes damage to neighboring components in a computer system such as a motherboard.

Furthermore, contemporary heat sink clips are frequently too weak to securely attach a heat sink to a CPU.

Therefore, an improved heat sink clip which overcomes the above-mentioned problems is desired.

BRIEF SUMMARY OF THE INVENTION

Accordingly, an object of the present invention is to provide a heat sink clip for readily attaching a heat sink to a CPU and readily detaching the heat sink therefrom.

Another object of the present invention is to provide a heat sink clip which securely attaches a heat sink to a CPU.

To achieve the above-mentioned objects, a heat sink clip comprises a handle portion, a connecting portion and a sliding portion. The handle portion has two side plates, a hook extending outwardly from one of the side plates, and a pressing cam formed at a bottom end of the other side plate. Each side plate defines a through hole and an arcuate sliding slot in the vicinity of the bottom end of the side plate. The connecting portion has a first cantilever and a first locking arm. The first cantilever has a pair of pivot holes in alignment with the through holes of the handle portion, for extension of a pin therethrough. The sliding portion has a second cantilever and a second locking arm. The second cantilever has a pair of pivot tabs for sliding along the sliding slots of the handle portion.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
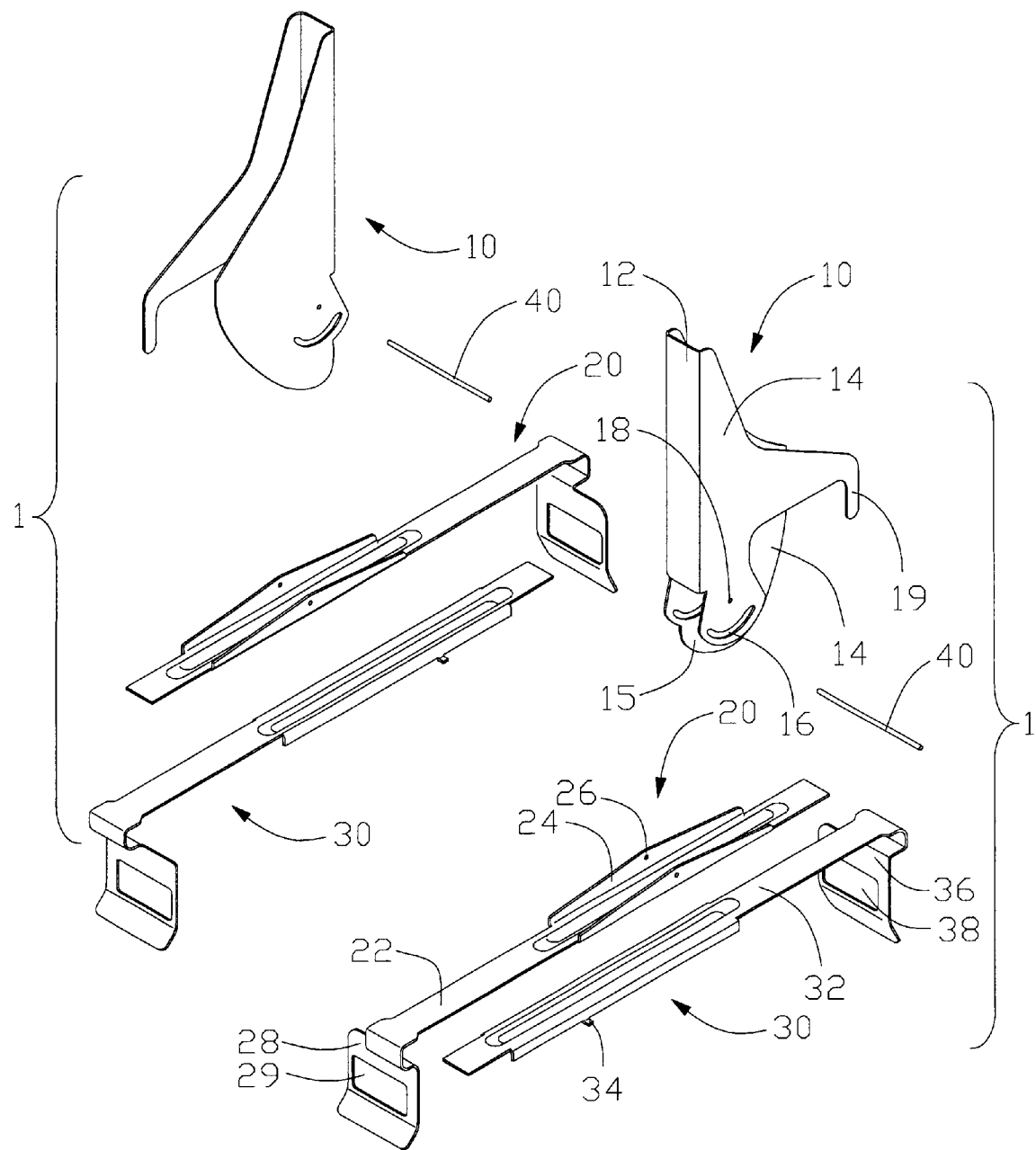
FIG. 1 is an exploded view of two heat sink clips of the present invention.
Figure 2:
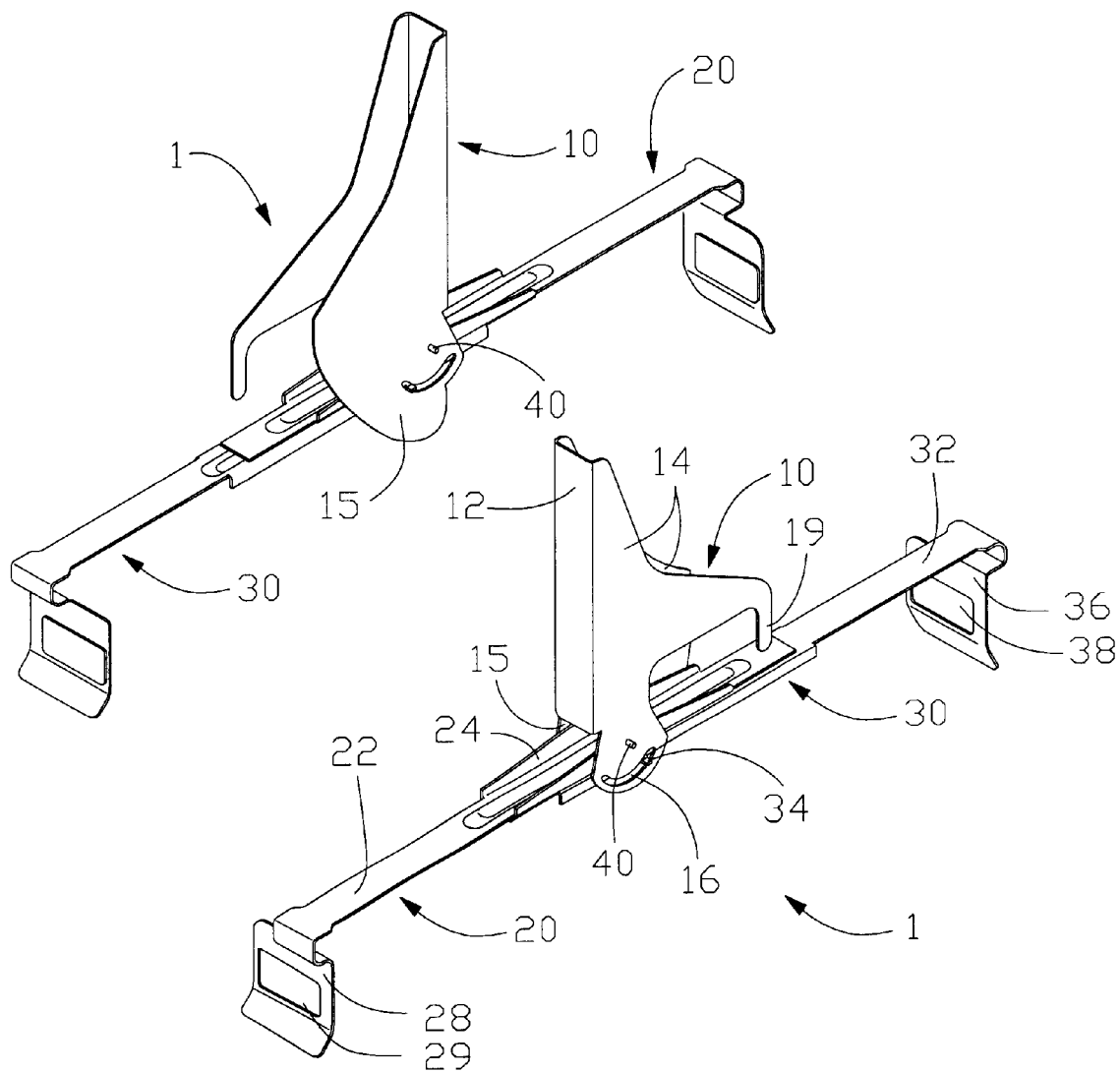
FIG. 2 is an assembled view of the two heat sink clips of FIG. 1.
Figure 3:
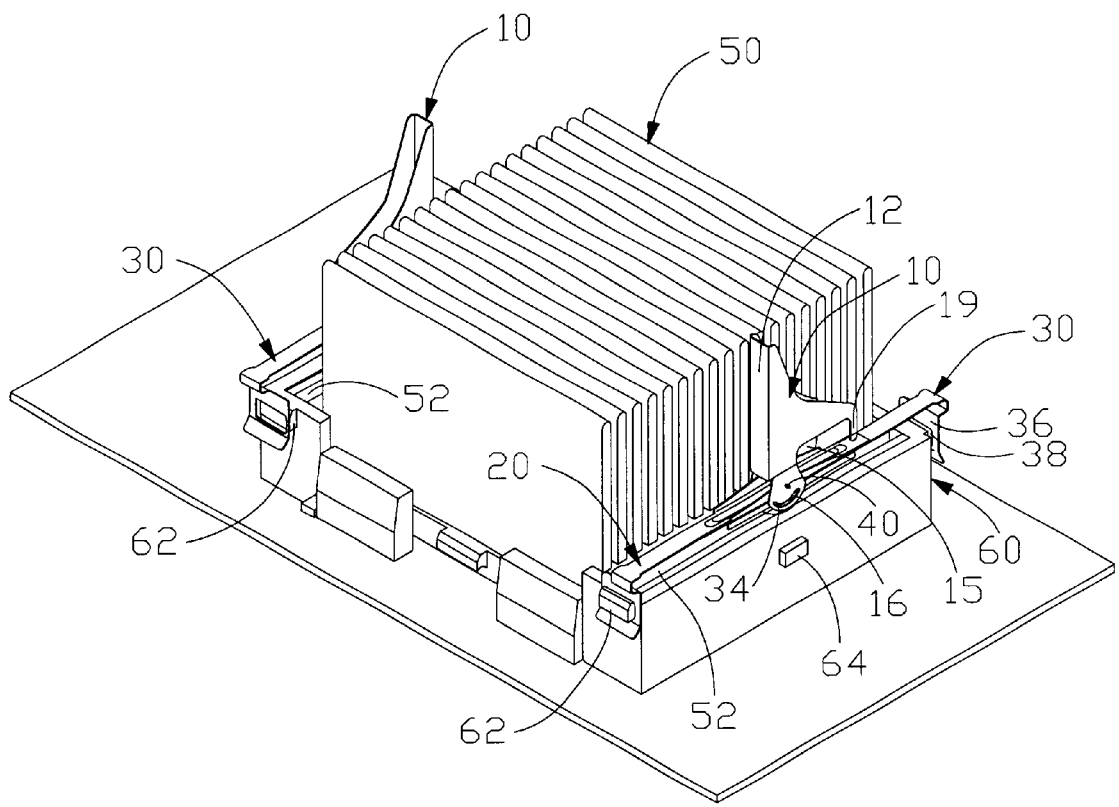
FIG. 3 is a perspective view of the two heat sink clips of FIG. 1 attaching a heat sink to a CPU mounted between a pair of retention modules, each clip being in an unlocked position.
Figure 4:
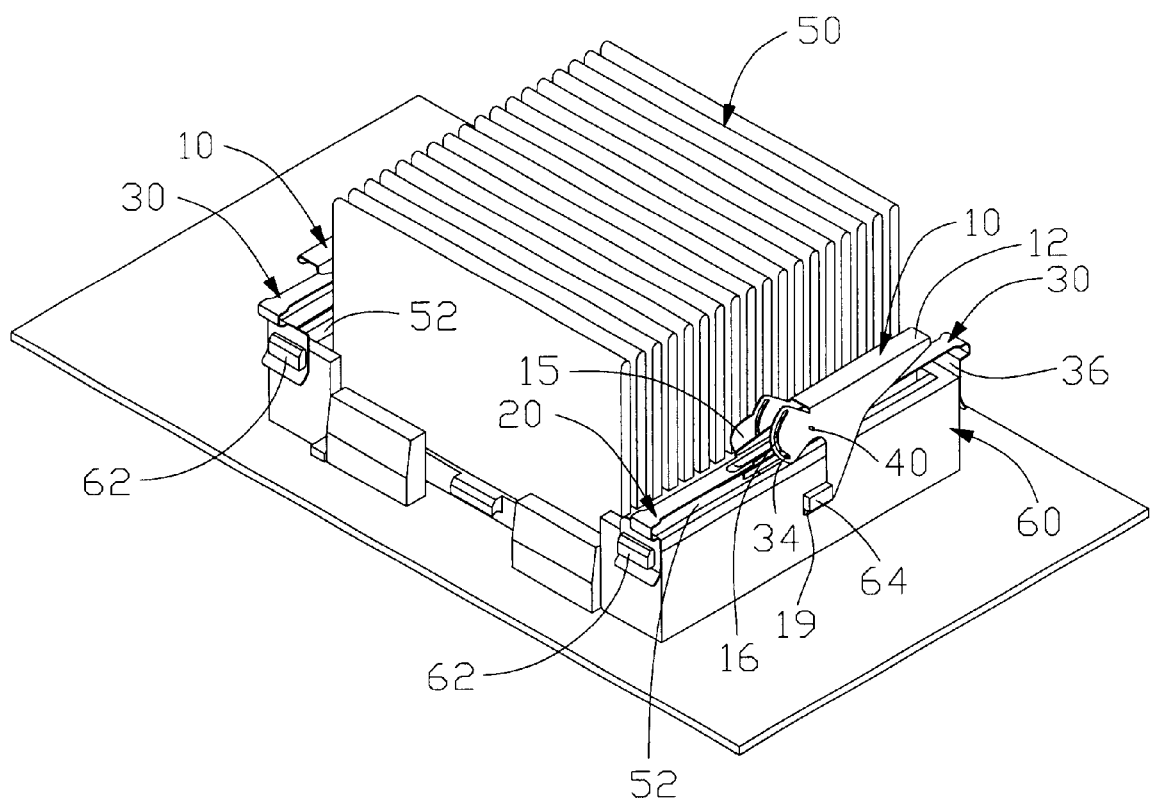
FIG. 4 is similar to FIG. 3, but showing each clip in a locked position.
Figure 5:
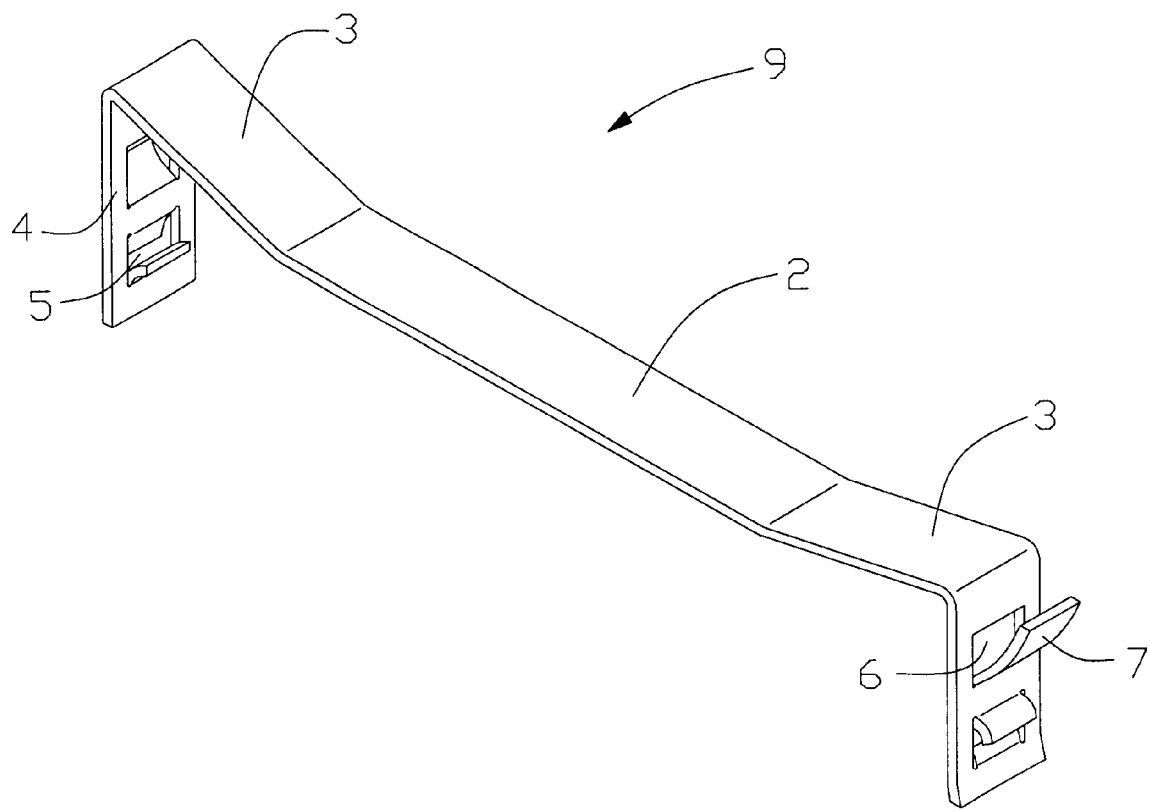
FIG. 5 is a perspective view of a conventional heat sink clip.
Figure 6:
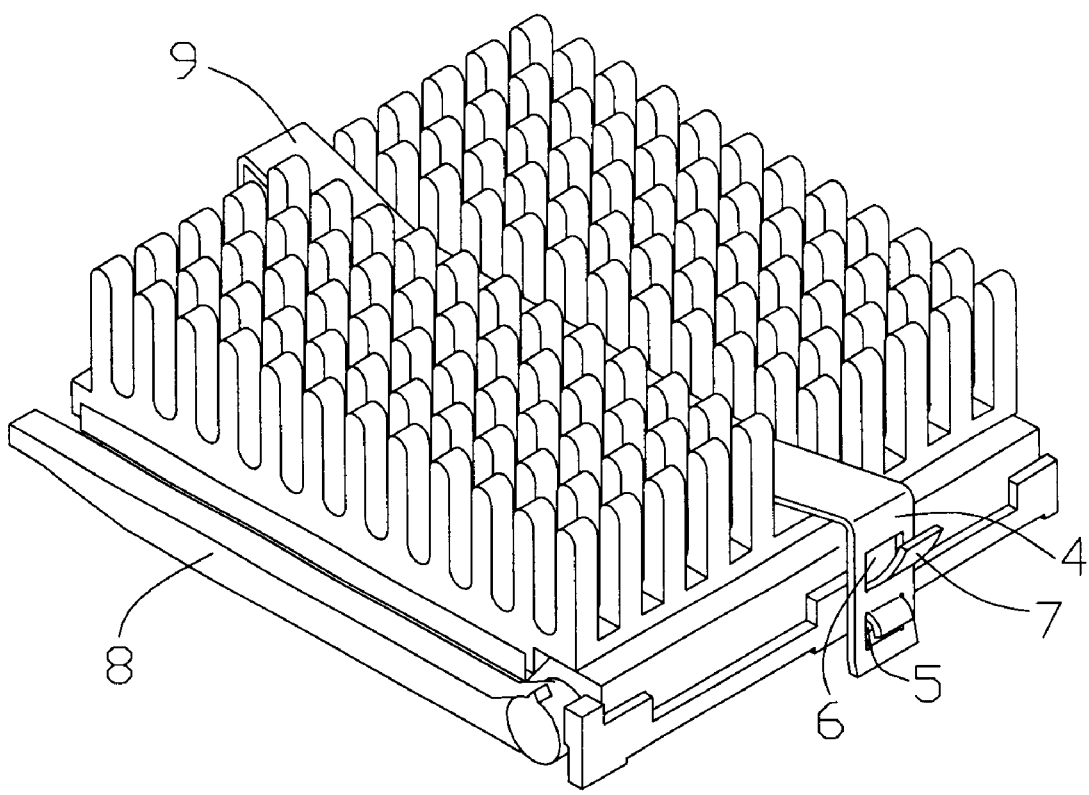
FIG. 6 is a perspective view of the clip of FIG. 5 attaching a heat sink to a CPU mounted on a socket.

Referring to FIGS. 1–4, a heat sink clip 1 in accordance with the present invention is used to engage with a retention module 60 and thereby firmly attach a heat sink 50 to a CPU (not shown). The retention module 60 forms a pair of catches 62 at opposite ends thereof respectively, and a latch 64 at a middle portion of an outer side wall thereof. A pair of parallel grooves 52 is respectively defined in the vicinity of opposite sides of a base (not labeled) of the heat sink 50.

Referring to FIG. 1, the heat sink clip 1 comprises a handle portion 10, a connecting portion 20 and a sliding portion 30. A pin 40 is used to movably connect the handle portion 10, the connecting portion 20, and the sliding portion 30.

The handle portion 10 has a handling plate 12, and two generally parallel side plates 14 extending perpendicularly from opposite lateral edges of the handling plate 12. A pair of parallel arcuate sliding slots 16 is respectively defined in the vicinity of bottom ends of the side plates 14. A pair of coaxial through holes 18 is respectively defined in the side plates 14, inwardly from and proximate to the respective sliding slots 16. A hook 19 extends perpendicularly from an edge of a middle portion of one side plate 14 opposite the handling plate 12, for engaging with the latch 64 of the retention module 60. A pressing cam 15 is formed at the bottom end of the other side plate 14.

The connecting portion 20 comprises a first horizontal cantilever 22. A pair of supporting flanges 24 is bent upwardly from opposite sides of the cantilever 22 respectively. A pair of coaxial pivot holes 26 is respectively defined in the supporting flanges 24, corresponding to the through holes 18 of the handle portion 10. A first locking arm 28 depends from one end of the cantilever 22. A first aperture 29 is defined in the first locking arm 28, for engagingly receiving the corresponding catch 62 of the retention module 60.

The sliding portion 30 comprises a second horizontal cantilever 32. A pair of pivot tabs 34 is formed outwardly from opposite side flanges (not labeled) of the horizontal cantilever 32 respectively, for being slidably accommodated in the arcuate sliding slots 16 of the handle portion 10. A second locking arm 36 depends from one end of the cantilever 32. A second aperture 38 is defined in the second locking arm 36, for engagingly receiving the corresponding catch 62 of the retention module 60.

In assembly of the heat sink clip 1, the connecting portion 20 is placed between the two side plates 14 of the handle portion 10 such that the pivot holes 26 of the supporting flanges 24 are in alignment with the through holes 18 of the handle portion 10. The pin 40 is extended through the pivot holes 26 and the through holes 18, thus pivotally connecting the connecting portion 20 and the handle portion 10 together. Then the sliding portion 30 is placed between the two side plates 14 of the handle portion 10, with the pivot tabs 34 being slidably received in the corresponding sliding slots 16 of handle portion 10 (see FIG. 2).

In use, the heat sink 50 is placed onto a top surface of the CPU (not shown). The heat sink 50 is accommodated between two retention modules 60. One heat sink clip 1 is placed on each of two sides of the heat sink 50, with each pressing cam 15 being received in the corresponding groove 52 of the heat sink 50. As the two clips 1 are identical, use of only one clip 1 is described hereafter.

The first aperture 29 of the connecting portion 20 is engaged with one of the catches 62 of the corresponding retention module 60. The sliding portion 30 is pushed toward the first locking arm 28 to make the second aperture 38 of the second locking arm 36 receive the other catch 62 of the retention module 60. In this unlocked position, the handling plate 12 of the handle portion 10 is upright (see FIG. 3). Then, the handling plate 12 is pressed and rotated downwardly. This drives the sliding portion 30 inwardly, and also upwardly toward the connecting portion 20. Simultaneously, the pressing cam 15 rotates in the groove 52 of the heat sink 50 and presses against the heat sink 50 at a bottom of the groove 52. This causes both the connecting portion 20 and the sliding portion 30 to rise. The handling plate 12 is continued to be rotated until the hook 19 of the handle portion 10 lockingly engages with the latch 64 of the retention 60 (see FIG. 4). In this locked position, the sliding portion 30 firmly abuts against the connecting portion 20, and the second locking arm 36 of the sliding portion 30 at the second aperture 38 firmly engages with the corresponding catch 62 of the retention module 60.

Removal of the heat sink clip 1 from the retention module 60 is essentially a reverse of the usage operation described above. The handling plate 12 of the handle portion 10 is pulled upwardly to drive the sliding portion 30 outwardly and downwardly. The second locking arm 36 of the sliding portion 30 at the second aperture 38 is thereby released from the corresponding catch 62 of the retention module 60.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink clip for attaching a heat sink to an electronic device, the heat sink clip comprising:

a handle portion having a handling plate and two side plates extending generally perpendicularly from opposite sides of the handling plate, each side plate defining a slot and a through hole proximate the slot, a hook extending generally perpendicularly from one of the side plates, a cam being formed at a bottom end of the other side plate;

a connecting portion having a first horizontal cantilever, a pair of flanges being bent upwardly from opposite sides of the first cantilever, each flange defining a pivot hole therein, the pivot holes being in alignment with the through holes of the handle portion for extension of a pit therethrough to pivotally connect the handle portion and the connecting portion, a first locking arm depending from one end of the connecting portion; and a sliding portion having a second horizontal cantilever, a pair of pivot tabs being formed at opposite side edges of the cantilever and being slidingly received in the slots of the handle portion, a second locking arm depending from one end of the sliding portion generally opposite the first locking arm of the connecting portion.

2. The heat sink clip as described in claim 1, wherein each slot is arcuate and is defined in the vicinity of a bottom end of the side plate of the handle portion.

3. The heat sink clip as described in claim 1, wherein the hook extends perpendicularly from an edge of a middle portion of the one of the side plates, such edge being generally opposite the handling plate.

4. The heat sink assembly as described in claim 1, wherein the first locking arm defines a first aperture therein, and the second locking arm defines a second aperture therein.

5. A heat sink assembly, comprising:

a heat sink adapted to be attached to a top face of an electronic device, the heat sink defining at least one groove in the vicinity of at least one side;

a retention module mounted to a motherboard and positioned beside the heat sink, the retention module having a pair of catches at opposite ends thereof and a latch at a side wall thereof; and a heat sink clip for attaching the heat sink to the electronic device, the clip comprising a handle portion, a connecting portion and a sliding portion, the handle portion having two side plates, a hook extending perpendicularly from one of the side plates for engaging with the latch of the retention module, a cam formed at a bottom end of the other side plate and received in the at least one groove of the heat sink, the connecting portion and the sliding portion having a first and a second horizontal cantilever respectively, the connecting portion and the sliding portion further having a first and a second locking arm depending from the first and second horizontal cantilevers respectively for engaging with the corresponding catches of the retention module, the first cantilever of the connecting portion pivotally connected to the handle portion, the second cantilever of the sliding portion slidably connected to the handle portion.

6. The heat sink assembly as described in claim 5, wherein the first cantilever of the connecting portion defines a pair of pivot holes at opposite side edges thereof in alignment with through holes of the handle portion for extension of a pin therethrough, whereby the handle portion is pivotally connected to the connecting portion.

7. The heat sink assembly as described in claim 5, wherein a pair of pivot tabs is formed at opposite side edges of the second cantilever of the sliding portion, for being slidably received in corresponding arcuate slots defined in the handle portion.

8. A clip for fastening a heat sink to an electronic device, the clip comprising:

a handle portion having a cam end, the handle portion being movable between first and second positions;

a connecting portion pivotably connected with the handle portion, a first locking arm depending from the connecting portion, the first locking arm being adapted for locking with a catch; and a sliding portion located below the connecting portion, the sliding portion drivably connected with the handle portion, a second locking arm depending from the sliding portion, the second locking arm being adapted for locking with a catch;

wherein when the handle portion is moved from the first position to the second position, the cam end movingly exerts downward pressing force against the heat sink and the first and second locking arms move toward each other.

9. The clip as described in claim 8, wherein the handle portion further has a hook, the hook being adapted for engaging with a latch when the handle portion is at the second position.

10. The clip as described in claim 8, wherein the handle portion defines an arcuate slot, the sliding portion forms a tab extending into the arcuate slot, and the clip has a pin extending through the handle portion and connecting portion to pivotably connect the handle portion and connecting portion together.

11. The clip as described in claim 10, wherein the handle portion further comprises two opposite side plates, the hook is formed on one of the side plates, and the cam end is formed on the other side plate.

* * * * *